United States Patent [19]

Cummins et al.

[11] 3,978,419

[45] Aug. 31, 1976

[54] TEMPERATURE AND SUPPLY VOLTAGE COMPENSATED AMPLIFYING DEVICE

[75] Inventors: Robert P. Cummins, Brainerd, Minn.; Paul C. Hunt, Cass County, N. Dak.

[73] Assignee: Minnesota Mining and Manufacturing Company, St. Paul, Minn.

[22] Filed: Jan. 6, 1975

[21] Appl. No.: 538,927

[52] U.S. Cl. .............................. 330/30 D; 317/18 D; 330/23; 330/69
[51] Int. Cl.² ........................................... H03F 3/45
[58] Field of Search ................. 317/18 D; 330/30 D, 330/23, 69

[56] References Cited
UNITED STATES PATENTS

| | | | |
|---|---|---|---|
| 3,401,351 | 9/1968 | Ellestad | 330/30 D X |
| 3,585,515 | 6/1971 | Riess | 330/30 D X |
| 3,769,548 | 10/1973 | Pardue | 317/18 D |
| 3,891,895 | 6/1975 | Wittlinger | 317/18 D |

*Primary Examiner*—John Kominski
*Assistant Examiner*—Lawrence J. Dahl
*Attorney, Agent, or Firm*—Alexander, Sell, Steldt & DeLaHunt

[57] ABSTRACT

A voltage amplifying device that is compensated to reduce variations in its output voltage due to changes in temperature or supply voltage by means of two transistors connected together so that changes in the base-emitter voltage of one transistor are counteracted by similar changes in the base-emitter voltage of the other transistor.

5 Claims, 3 Drawing Figures

U.S. Patent  Aug. 31, 1976  3,978,419

TEMPERATURE AND SUPPLY VOLTAGE COMPENSATED AMPLIFYING DEVICE

BACKGROUND OF THE INVENTION

1. Field of the Invention

The present invention relates to amplifiers with operating points compensated for changes in temperature as well as for changes in supply voltage.

2. Description of the Prior Art

Differential amplifiers are commonly used in the art to provide a reliable and inexpensive means for furnishing amplification with low sensitivity to temperature or supply voltage variations. However, such amplifiers usually require relatively complex circuitry to accomplish both of these features.

Circuits similar to the present invention have been used to reduce temperature sensitivity problems, but such circuits have been highly sensitive to changes in supply voltages due to their particular operating conditions. Examples of such circuits appear in RCA application note ICAN-5296, FIGS. 6, 8 and 9. Other similar circuits are used in high fidelity complementary symmetry amplifiers as exemplified by RCA application note ICAN-6048, FIG. 7.

In contrast to such prior art circuits, the present invention is relatively simplistic, but yet is compensated to provide a low sensitivity to both temperature and supply voltage variations.

SUMMARY OF THE INVENTION

The present invention provides a voltage amplifying device that includes two amplifier branches that each include a transistor with a base terminal connected to one side of a source of input signal voltage in order that variations in the voltage potentials at the base terminals of the transistors in such branches that are due to variations in temperature and supply voltage offset one another to provide output signal voltages that are substantially compensated for such variations in temperature and supply voltage.

The transistor of each amplifier branch also has a collector terminal connected through a resistor to one side of a d.c. power supply voltage source and an emitter terminal connected to the opposite side of the power supply voltage source. The base terminal of each transistor is connected through one resistor to the opposite side of the power supply voltage source and through a feedback circuit to the collector terminal. preferably, the components of each amplifier branch are equal in value to their corresponding counterpart in the other branch in order that the collector currents of both branches are equal and thereby provide optimum compensating operation. As a result, if input signal voltage devices are a.c. coupled to the amplifying device of the present invention much shorter periods are required for the device to adjust to such coupling.

In a modified embodiment, an additional amplifier branch is connected to at least one output signal terminal of the amplifying device to provide compensation for changes in operating points of the transistors of the amplifier branches.

Accordingly, the present invention provides an amplifying device that is compensated for variations in temperature and supply voltage, is relatively simplistic in both design and operation, but yet provides precisely controlled operating points over a wide range of voltages and temperatures.

The foregoing and other advantages of the present invention will appear from the following description. In the description reference is made to the accompanying drawings, which form a part hereof, and in which there is shown by way of illustration, and not of limitation, a specific form in which the invention may be embodied. Such embodiment does not represent the full scope of the invention, but rather the invention may be employed in a variety of embodiments, and reference is made to the claims herein for interpreting the breadth of the invention.

DESCRIPTION OF THE PREFERRED EMBODIMENTS

Figure 1:
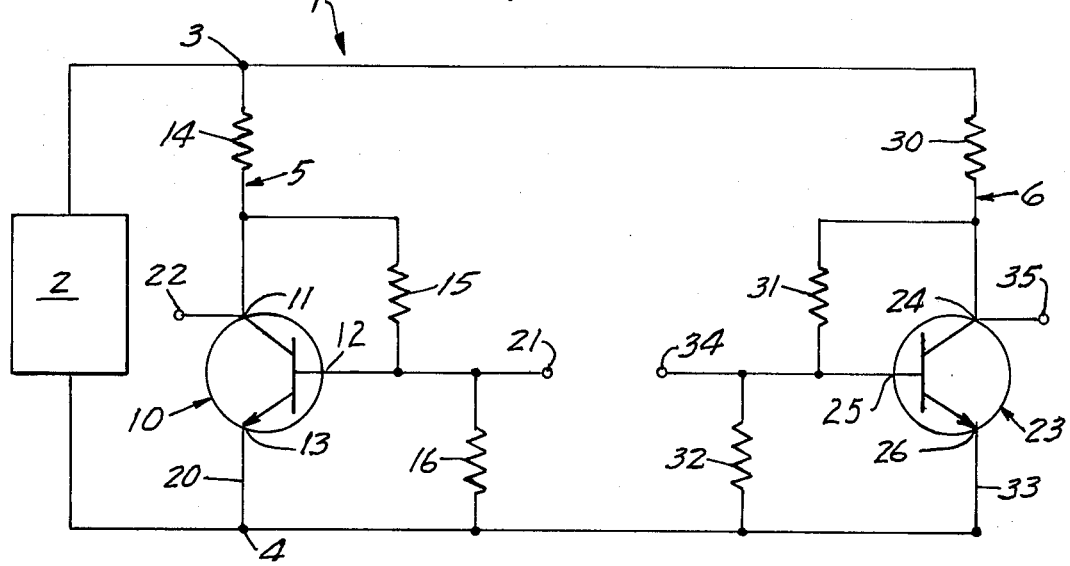
FIG. 1 is a schematic diagram of a preferred embodiment of the compensated amplifying device of the present invention.

Referring now to the drawings and with specific reference first to FIG. 1, a presently preferred embodiment of the present invention is shown in the form of a compensated amplifier circuit 1 adapted to provide an amplifying means with at least one output signal voltage that is substantially unaffected by changes in supply voltage or temperature. A d.c. power supply 2 is connected to the circuit 1 across nodes 3 and 4 to supply power to two transistor amplfier branches 5 and 6 forming the circuit 1.

The amplifier branch 5 includes an NPN bipolar transistor 10 having collector, base and emitter terminals 11, 12 and 13 respectively, a resistor 14 connected between node 3 and the collector terminal 11, a feedback circuit comprising a resistor 15 connected between the collector and base terminals 11 and 12, a resistor 16 connected between the base terminal 12 and the node 4, and an electrically conductive lead 20 connecting the emitter terminal 13 to the node 4. In addition, an input terminal 21 is connected to the base terminal 12 and an output terminal 22 is connected to the collector terminal 11.

The amplifier branch 6 is constructed with components similar to those of the amplifier branch 5 and includes an NPN bipolar transistor 23 having collector, base and emitter terminals 24, 25 and 26 respectively, a resistor 30 connected between the node 3 and the collector terminal 24, a feedback circuit comprising a resistor 31 connected between the collector and base terminals 24 and 25, a resistor 32 connected between the base terminal 25 and the node 4, an electrically conductive lead 33 connected between the emitter terminal 26 and the node 4, an input terminal 34 connected to the base terminal 25 and an output terminal 35 connected to the collector terminal 24.

The circuit 1 is adapted to monitor an input signal voltage applied across input terminals 21 and 34 and provide at output terminals 22 and 35 output signal voltages that are compensated for variations in temperature and supply voltage. Such compensation is completely absent in a standard amplifying circuit constructed of a ingle amplifier branch such as the branch 5. If the circuit 1 was constructed of only the amplifier branch 5 and an input voltage was applied across input terminal 21 and node 4, variations in the base-emitter voltage of transistor 10 due to changes in temperature and supply voltage would be indistinguishable from variations in input voltage applied, and would therefore be amplified to form a portion of the circuit output at the terminal 22. Such variations in base-emitter voltage as a result of changes in temperature and supply voltage theoretically substantially conform to the equation $V_{be}=AT\text{Log}_e(I_c)+B$, wherein $A$ is a constant that is substantially the same for similar transistor devices, $B$ is a constant that depends primarily on the current gain of the particular transistor device involved, and $T$ is the absolute temperature of the transistor in degrees Kelvin. Actual devices may deviate from the above equation, particularly at high currents.

The use of the two amplifier branches 5 and 6 in the present invention is made in order that the variations in base-emitter voltages of the transistors 10 and 23 will cancel out one another in the following manner.

Application of supply voltage to the amplifier branches 5 and 6 biases the transistors 10 and 23 with initial base-emitter voltages determined by the magnitude of the supply voltage, the value of the resistors in each branch, and the relationship of the base-emitter voltages to the collector currents of the branches 5 and 6 as set forth in the above equation. If the collector currents of the amplifier branches 5 and 6 are maintained similar in spite of temperature and supply voltage variations, the base-emitter voltage of the transistor 10 will substantially equal the base-emitter voltage of the transistor 23. Accordingly, the voltage potentials at the base terminals 12 and 25 of the transistors 10 and 23 respectively would substantially equal one another, regardless of wide ranges of temperature and supply voltage variations in the circuit 1. One method of maintaining similar collector currents in the branches 5 and 6 is the use of similar valued components in both branches.

It should be noted that the transistors 10 and 23 should have good saturation characteristics for optimum operation of the circuit 1. Also, if the collector currents of the amplifier branches 5 and 6 are not the same, but are merely proportional to one another, insensitivity to supply voltage variations will be provided by the present invention, but variations in the output voltages of the circuit 1 due to temperature will be proportional to the logarithm of the ratio of the collector currents.

Thus, by choosing the components of the branches 5 and 6 so that the voltage potentials at the base terminals of the transistors 10 and 23 are substantially equal to one another, application of an input voltage across the terminals 21 and 34 by an input voltage source (not shown) having an internal impedance will result in variations in the output voltages of the branches 5 and 6 that are almost solely reflective of input voltage applied except for minor variations due to changes in the operating points of the transistors 10 and 23 in response to change in base-emitter voltages thereof.

Figure 2:
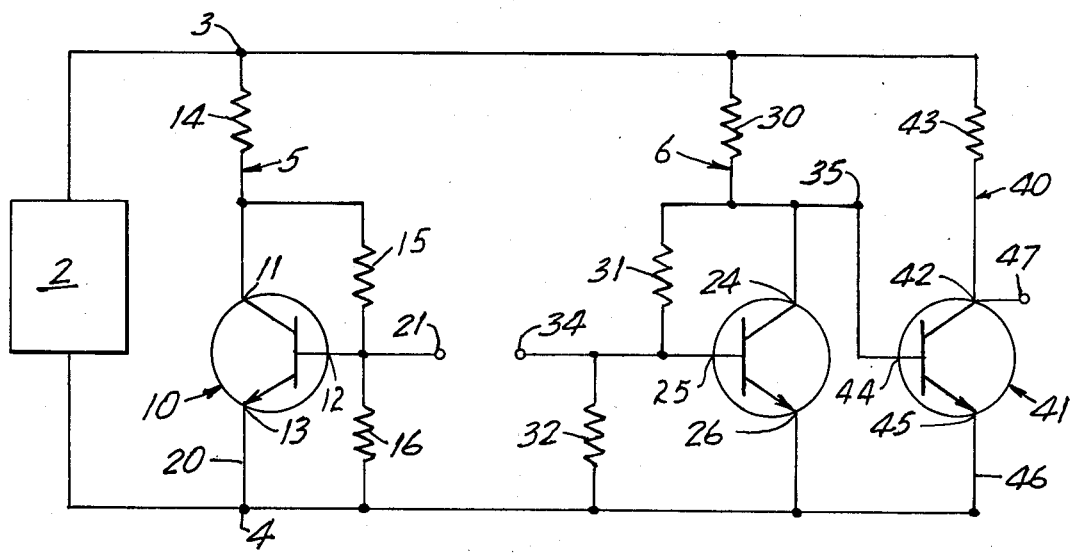
FIG. 2 is a schematic diagram of a modified embodiment of the compensated amplifying device shown in FIG. 1 incorporating an additional amplifier branch.

To provide even further compensation, variations in the output voltages at the terminals 22 and 35 because of changes in the operating points of the transistors 10 annd 23 can be substantially eliminated by employing an additional amplifier branch with each branch 5 and 6 of the circuit 1. One such additional branch is shown in FIG. 2 connected to the output terminal 35. The circuit of FIG. 2 is essentially the same as that of FIG. 1 except for the addition of the amplifier branch 40. The branch 40 has an NPN bipolar transistor 41 with a collector terminal 42 connected through a resistor 43 to the node 3, a base terminal 44 connected to the output terminal 35 of the branch 6, and an emitter terminal 45 connected to the node 4 by an electrically conductive lead 46. The amplifier branch 40 also has an output signal terminal 47 connected to the collector terminal 42.

The transistor 41 is biased to operate close to saturation in order that the voltage drop across resistor 43 substantially equals the drop across the resistor 30. Also, the resistor 31 is much lower in value than the resistor 32 so that the voltage potential at the terminal 35 is substantially equal to the voltage potential at the base of the transistor 23. To more fully understand the present modification of the invention, its effect on the output voltage of the circuit 1 provided at the terminal 35 will now be described.

When the base-emitter voltage of the transistor 23 is varied, for example increased, due to increases in supply voltage or decreases in temperature, the voltage potential at the collector terminal 24 will increase. This increase will be substantially compensated for by similar variations in the base-emitter voltage to the transistor 41. Consequently, by using the additional amplifier branch 40 compensation of the circuit 1 is improved.

Figure 3:
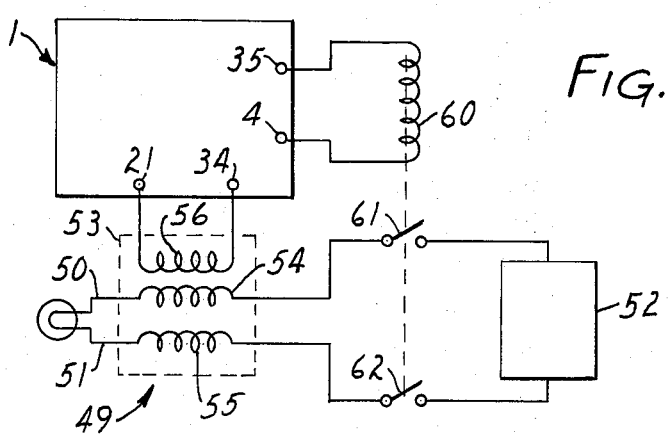
FIG. 3 is a schematic diagram of the embodiment of FIG. 1 incorporated in a conventional ground fault circuit interrupter.

Thus, the present invention provides an amplifying circuit that may be employed with unregulated power supplies and under varying temperature conditions, but yet will provide output voltages with variations that are substantially reflective of only input voltage changes. Accordingly, the present invention is particularly adapted to be employed as part of a circuit that must be relatively stable in spite of temperature or supply voltage variations. For example, the present invention is ideally suited for use in a ground fault circuit interrupter (GFCI) 49 as indicated by FIG. 3. The GFCI circuit 49 is shown in FIG. 3 together with a pair of standard a.c. power distribution lines 50 and 51 for furnishing power to a load 52. The function of the GFCI circuit 49 is to open both the power lines whenever a stray path to ground occurs on either or both of the lines 50, 51. Thus, for example if a child touches one of the lines 50 or 51 to provide a stray path to ground, the GFCI circuit 49 will immediately actuate to deenergize the lines 50 and 51 and prevent serious injury to the child.

The GFCI circuit 49 includes a differential transformer 53 (enclosed by broken lines) that has a pair of primary windings 54, 55 each respectively located in one of the lines 50, 51 and a secondary winding 56 that is connected to the input terminals 21 and 34 of the circuit 1. Connected across the output terminal 35 and the node 4 of the circuit 1 is a d.c. relay coil 60 of a single throw double pole relay having one pole 61, 62 respectively in each of the lines 50, 51.

When the a.c. lines 50, 51 do not have a stray ground connection, equal current flow through the primary windings 54, 55 of the differential transformer 53 and the fields produced thereby cancel one another. In contrast to such normal operation, when a stray path to ground occurs on one of the lines 50, 51, current flow through the windings 54, 55 is unbalanced because current will flow through the stray path to ground. As a result, the fields of the primary windings 54, 55 are unequal and an a.c. current in the secondary windings 56 is developed. The voltage produced by the current flowing through the winding 56 is amplified by the circuit 1 sufficiently to actuate the relay coil 60 and to open both the a.c. lines 50, 51. Thus, it is highly important that the circuit 1 provide an output that is substantially indicative of current in the secondary winding 56 in order that the coil 60 will not be spuriously energized.

Although a preferred embodiment has been shown and described herein, it should be understood that many modifications could be made in such embodiment without departing from the true spirit and scope of the present invention. For example, if only the output voltage at the terminal 35 were desired to be used, it would be possible to eliminate the resistors 16 and 32 and short circuit the resistor 15. Also changes in the feedback circuits of the amplifier branches 5 and 6 are possible. The circuit 1 may be desensitized to noise by the addition of capacitors between the node 4 and the output terminals 22 and 35. As a result of such addition, the nonlinear characteristics of the transistors 10 and 23 will result in rectification of noise pulses such that the output signal voltage at terminals 22 and 35 are reduced. This effect may be desirable in some uses of the present invention and undesirable in others.

What is claimed is:

1. A voltage amplifying device that is compensated to reduce variations in its output signal voltage due to changes in temperature or supply voltage provided by an electrical power source, which device comprises:

a first amplifier branch having a transistor with a collector terminal connected through a resistor to one side of said power source, an emitter terminal connnected to the opposite side of said power source by a conductive lead having substantially no resistance, and a base terminal connected to a first input signal terminal and also connected to said collector terminal by a feedback circuit; and a second amplifier branch having a transistor with a collector terminal connected through a resistor to one side of said power source, an emitter terminal connected to the opposite side of said power source by a conductive lead having substantially no resistance, and a base terminal connected to a second input signal terminal and also connected to said collector terminal by a feedback circuit, whereby variations in the voltage potentials at the base terminals of the transistors in said amplifier branches that are due to variations in temperature and supply voltage offset one another to inhibit changes in the output signals at the collector terminals of said branches in response to said variations in temperature and supply voltage.

2. An amplifying device as recited in claim 1 wherein said feedback circuits of each of said amplifier branches includes a resistor connected between the collector and base terminals of said branch, and each of said base terminals is further connected by a resistor to said opposite side of said power source.

3. An amplifying device as recited in claim 2 wherein said device further includes a third amplifier branch having a transistor with a collector connected to said one side of said power source through a resistor, an emitter terminal connected to said other side of said power source and a base terminal directly connected to the collector terminal of one of said amplifier branches in order that variations in conduction through the transistor of said one branch are compensated by opposite variations in conduction through the transistor of said third branch.

4. An amplifying device as recited in claim 2 wherein the components of said first amplifier branch are equal in value and operating characteristics to its corresponding components in said second amplifier branch in order that the collector currents of said branches normally are equal to one another.

5. In a ground fault circuit interrupter for opening at least one line of an a.c. power distribution system upon the development of a stray path to ground from one of said lines and including a differential transformer having a pair of primary windings in series with each of said distribution lines, a secondary winding that is induced with electrical current by the primary windings and a voltage amplifying device comprising:

a first amplifier branch having a transistor with a collector terminal connected through a resistor to one side of said power source, an emitter terminal connected to the opposite side of said power source by a conductive lead having substantially no resistance, and a base terminal connected to a first input signal terminal and also connected to said collector terminal by a feedback circuit; and a second amplifier branch having a transistor with a collector terminal connected through a resistor to one side of said power source, an emitter terminal connected to the opposite side of said power source by a conductive lead having substantially no resistance, and a base terminal connected to a second input signal terminal and also connected to said collector terminal by a feedback circuit, whereby said input signal terminals are connected together by the secondary winding of said differential transformer.

* * * * *

UNITED STATES PATENT AND TRADEMARK OFFICE
CERTIFICATE OF CORRECTION

PATENT NO. : 3,978,419

DATED : August 31, 1976

INVENTOR(S) : Robert P. Cummins and Paul C. Hunt

It is certified that error appears in the above-identified patent and that said Letters Patent are hereby corrected as shown below:

Column 2, line 68, change "ingle" to --- single ---.

Column 3, line 61, change "change" to --- changes ---.

Column 4, line 26, change "to" to --- of ---;

Column 4, line 60, change "flow" to --- flows ---;

Column 4, line 68, change "windings" to --- winding ---.

Signed and Sealed this

Twenty-eighth Day of December 1976

[SEAL]

Attest:

RUTH C. MASON
*Attesting Officer*

C. MARSHALL DANN
*Commissioner of Patents and Trademarks*